Ħ US007948157B2

(12) United States Patent
Iwatate et al.

(10) Patent No.: US 7,948,157 B2
(45) Date of Patent: May 24, 2011

(54) PIEZOELECTRIC OSCILLATOR HAVING A TUNING FORK PIEZOELECTRIC VIBRATING PIECE

(75) Inventors: Mitsuo Iwatate, Chiba (JP); Yoshifumi Nishino, Chiba (JP)

(73) Assignee: Seiko Instruments, Inc. (JP)

( * ) Notice: Subject to any disclaimer, the term of this patent is extended or adjusted under 35 U.S.C. 154(b) by 302 days.

(21) Appl. No.: 12/339,809

(22) Filed: Dec. 19, 2008

(65) Prior Publication Data
US 2009/0160295 A1 Jun. 25, 2009

(30) Foreign Application Priority Data

Dec. 21, 2007 (JP) .................. 2007-329432
Nov. 25, 2008 (JP) .................. 2008-299367

(51) Int. Cl.
*H03H 9/19* (2006.01)
(52) U.S. Cl. ........................ 310/370; 310/312
(58) Field of Classification Search .................. 310/370
See application file for complete search history.

(56) References Cited

U.S. PATENT DOCUMENTS

| 4,771,202 A | * | 9/1988 | Takahashi | 310/312 |
| 7,417,362 B2 | * | 8/2008 | Satoh et al. | 310/370 |
| 7,764,145 B2 | * | 7/2010 | Iwai | 333/200 |

FOREIGN PATENT DOCUMENTS

| JP | 57060720 A | * | 4/1982 |
| JP | 57199310 A | * | 12/1982 |
| JP | 2003-133879 A | | 5/2003 |
| JP | 2006311444 A | * | 11/2006 |

* cited by examiner

*Primary Examiner* — J. SanMartin
(74) *Attorney, Agent, or Firm* — Brinks Hofer Gilson & Lione

(57) ABSTRACT

A piezoelectric oscillator which can conduct fine trimming adjustment and adjust frequencies highly precisely, particularly with no use of an expensive laser trimming apparatus with a small spot diameter, and a method of the same are provided. The method includes: a first step wherein a first spot train is formed on a mass adjustment film at a pitch smaller than the diameter of a film removal spot matched with the spot diameter of laser, and a second step wherein a train space to the first spot train is adjusted in accordance with the target frequency of a tuning fork crystal vibrating piece to form a second train and after, and these steps are in turn conducted, whereby fine trimming adjustment is performed.

16 Claims, 11 Drawing Sheets

PIEZOELECTRIC OSCILLATOR HAVING A TUNING FORK PIEZOELECTRIC VIBRATING PIECE

RELATED APPLICATION

This application claims priority under 35 U.S.C. §119 to Japanese Patent Application Nos. JP2007-329432 filed on Dec. 21, 2007, and JP2008-299367 filed on Nov. 25, 2008, the entire contents of which are hereby incorporated by references.

BACKGROUND OF THE INVENTION

1. Field of the Invention

The present invention relates to a piezoelectric oscillator having a tuning fork piezoelectric vibrating piece sealed in a package and a method of the same, and to a technique in which a thin film attached on a piezoelectric oscillator is removed to adjust oscillation frequencies.

2. Description of the Related Art

As a method of adjusting an oscillation frequency in the case of fabricating a piezoelectric oscillator such as a tuning fork crystal oscillator, there is a method in which a trimming area is provided on a device and a thin film attached as a weight material is trimmed by a laser beam. As this type of technique, for example, a method of fabricating a piezoelectric oscillator and a piezoelectric device described in Patent Reference 1 is known (see JP-A-2003-133879). In the piezoelectric oscillator described in Patent Reference 1, as shown in FIG. 9, on an oscillating arm 1A of a tuning fork crystal vibrating piece 1, a weight portion 3 is provided, having a mass adjustment film 2 that the mass is increased and decreased to adjust oscillation frequencies. The mass adjustment film 2 is formed of a deposition film 4 (coarse tuning portion) that Au is deposited to be a weight for coarse tuning, and a sputter film 5 (fine tuning portion) that Cr is sputtered to be a weight for fine tuning, in which on the top surface of the tuning fork crystal vibrating piece 1 below the weight portion 3, a predetermined electrode 6 is patterned by the photolithographic technique. Then, in the piezoelectric oscillator, as shown in FIG. 10, the deposition film 4 and the sputter film 5 of the weight portion 3 are trimmed with a laser beam to partially form a plurality of film removal spots having the diameter matched with the spot diameter of laser for adjustment so that spot trains 7 and 8 formed of a plurality of the film removal spots allow the frequency of the tuning fork crystal vibrating piece 1 to be a target frequency.

From the recent trend in miniaturization of components, oscillators are also shrunk in size, and the frequency change per unit mass of the weight used for trimming becomes greater. In order to adjust frequencies highly precisely, it is necessary to finely control the trimming amount of the weight. However, it is difficult to provide a smaller spot diameter of the laser beam for trimming, which becomes a problem of securing precise oscillation of a small-sized oscillator. In order to cope with this problem, the following schemes (1) and (2) are shown.

(1) Such laser is used that the spot diameter of laser can be made smaller. When an amount of processing is still necessary, the deposition film 4 to be the weight for coarse tuning and the sputter film 5 to be the weight for fine tuning are trimmed, in which as shown in FIG. 11, the sputter film 5 is first trimmed with a larger spot diameter (indicated by a sign 8A), and is trimmed with a smaller spot in fine tuning that requires accuracy (indicated by a sign 8B).

(2) As shown in FIG. 12, the pitch of the later spot is reduced to "P2" from "P1" which is the diameter of the spot in order to decrease the trimming amount per unit pulse (see Patent Reference 1). In order to secure adjustment accuracy, trimming is conducted in the lateral direction in which an amount of change per unit mass of the weight becomes constant. When trimming of a train is finished, the diameter of the later spot is set to a fixed amount (d1), which is the same as the spot diameter, and the later spot is moved in the column direction (the vertical direction in this drawing), and then the subsequent train is processed.

In the trimming scheme conducted by changing the spot position of laser, the following problems arise. In the scheme (1), although accuracy can improve while securing the adjustment efficiency, in a standard laser trimming apparatus, the diameter is generally about 20 μm at most even though the spot diameter is made smaller. A laser trimming apparatus having the spot diameter smaller than that diameter is very expensive, which increase production cost. In addition, in the scheme (2), the resolution of adjusting frequencies in the lateral direction can be improved when the pitch can be set small as indicated by "P1>P2". However, as the oscillator reduced in size has the small width of the tuning fork crystal vibrating piece 1 and the small weight portion 3 at the end part thereof. Accordingly, it is unable to provide a long trimming length. For this reason, the application position is to be shifted in the column direction. Generally, because a feed d1 to be set is about the spot diameter of the laser, it is unable to implement frequency adjustment with high precision according to trimming based on this feed.

SUMMARY OF THE INVENTION

The invention is to solve the problems discussed above. An object is to provide a piezoelectric oscillator which can conduct fine trimming adjustment and highly precise frequency adjustment particularly with no use of an expensive laser trimming apparatus with a small spot diameter, and a method of the same.

Then, in order to achieve the object, a piezoelectric oscillator according to the invention is a piezoelectric oscillator including: a weight portion having a mass adjustment film for frequency adjustment laminated on an oscillating arm of a tuning fork crystal vibrating piece, wherein the weight portion is formed with a plurality of film removal spots in which the mass adjustment film is partially removed as corresponding to a spot diameter by laser application, whereby adjustment is conducted so that a frequency of the tuning fork crystal vibrating piece becomes a target frequency, wherein on the mass adjustment film, a plurality of spot trains is provided, the spot train having the film removal spots arranged at a pitch smaller than a diameter thereof, and a train space between the plurality of the spot trains is arranged at a space smaller than the diameter of the film removal spot and adjusted in accordance with the target frequency of the tuning fork crystal vibrating piece.

According to the invention, a plurality of spot trains is provided on the mass adjustment film, the spot train having the film removal spots arranged at a pitch smaller than the diameter thereof, and the train space between the plurality of the spot trains is set at a space smaller than the diameter of the film removal spot as corresponding to the target frequency of the tuning fork crystal vibrating piece. Then, by the space settings of a plurality of the spot trains, such a piezoelectric oscillator can be obtained that trimming is finely adjusted in a high resolution. In other words, with no use of an expensive laser trimming apparatus with a small spot diameter as before, such a piezoelectric oscillator can be obtained that the frequency is close to the target frequency of the tuning fork crystal vibrating piece.

In addition, a piezoelectric oscillator according to the invention is a piezoelectric oscillator including: a weight portion having a mass adjustment film for frequency adjustment laminated on an oscillating arm of a tuning fork crystal vibrating piece, wherein the weight portion is formed with a plurality of film removal spots in which the mass adjustment film is partially removed as corresponding to a spot diameter by laser application, whereby adjustment is conducted so that a frequency of the tuning fork crystal vibrating piece becomes a target frequency, wherein on the mass adjustment film, a plurality of spot trains is arranged, the spot train having the film removal spots arranged at a pitch smaller than a diameter thereof, and film removal spots in the first spot train are positioned in a tip end area of the mass adjustment film, and a part of each of the film removal spots is extended outward from the tip end area of the mass adjustment film, whereby the film removal spots are formed in a shape partially cut.

According to the invention, a plurality of spot trains is provided on the mass adjustment film, the spot train having the film removal spots arranged at a pitch smaller than the diameter thereof, and among a plurality of the spot trains, the first spot train is formed of the film removal spots in a shape partially cut, the film removal spots positioned in the tip end area of the mass adjustment film. Then, by the arrangement of the spot train formed of the film removal spots in a shape partially cut, such a piezoelectric oscillator can be obtained that trimming is finely adjusted in a high resolution. In other words, with no use of an expensive laser trimming apparatus with a small spot diameter as before, such a piezoelectric oscillator can be obtained that the frequency is close to the target frequency of the tuning fork crystal vibrating piece.

In addition, in the piezoelectric oscillator according to the invention, preferably, the mass adjustment film of the weight portion is configured of a coarse tuning film to be a weight for coarse tuning, and a fine tuning film to be a weight for fine tuning spaced from the coarse tuning film, on at least one of the coarse tuning film and the fine tuning film, a plurality of spot trains is arranged, the spot train having the film removal spots arranged at a pitch smaller than a diameter thereof, and among the plurality of the spot trains, film removal spots in the first spot train are positioned in a tip end area of at least one of the coarse tuning film and the fine tuning film, and a part of each of the film removal spots is extended outward from the tip end area of at least one of the coarse tuning film and the fine tuning film, whereby the film removal spots are formed in a shape partially cut.

In this case, the spot train formed of the film removal spots in a shape partially cut described above is provided on at least one of the coarse tuning film and the fine tuning film configuring the mass adjustment film of the weight portion, whereby such a piezoelectric oscillator can be obtained that finer trimming adjustment is conducted.

In addition, a piezoelectric oscillator according to the invention is a piezoelectric oscillator including: a weight portion having a mass adjustment film for frequency adjustment laminated on an oscillating arm of a tuning fork crystal vibrating piece, wherein the weight portion is formed with a plurality of film removal spots in which the mass adjustment film is partially removed as corresponding to a spot diameter by laser application, whereby adjustment is conducted so that a frequency of the tuning fork crystal vibrating piece becomes a target frequency, wherein on the mass adjustment film, a plurality of spot trains is arranged, the spot train having the film removal spots arranged at a pitch smaller than a diameter thereof, and among the plurality of the spot trains, film removal spots positioned in a side end part thereof are positioned in a side edge area of the mass adjustment film, and a part of each of the film removal spots is extended outward from the side edge area of the mass adjustment film, whereby the film removal spots are formed in a shape partially cut.

In this case, a plurality of spot trains is provided on the mass adjustment film, the spot train having the film removal spots arranged at a pitch smaller than the diameter thereof, and among a plurality of the spot trains, the film removal spots positioned in the side end part are positioned in the side edge area of the mass adjustment film, whereby the film removal spots are formed in a shape partially cut. Then, the film removal spots in a shape partially cut are arranged in the side edge area of the mass adjustment film, whereby such a piezoelectric oscillator can be obtained that trimming is finely adjusted in a high resolution. In other words, with no use of an expensive laser trimming apparatus with a small spot diameter as before, such a piezoelectric oscillator can be obtained that the frequency is close to the target frequency of the tuning fork crystal vibrating piece.

In addition, in the piezoelectric oscillator according to the invention, preferably, the individual spot trains are divided and arranged on the right and left sides on the mass adjustment film, and among a plurality of the spot trains divided on the right and left sides, a part of each of the film removal spots is extended outward from each of the right and left side edge areas of the mass adjustment film, whereby film removal spots positioned at each of the side end parts are formed in a shape partially cut.

In this case, among a plurality of the spot trains divided on the right and left sides, the film removal spots positioned in each of the side end parts are positioned in each of the right and left side edge areas of the mass adjustment film, and the film removal spots are formed in a shape partially cut, whereby such a piezoelectric oscillator can be obtained that finer trimming adjustment is conducted.

In addition, a method of fabricating a piezoelectric oscillator according to the invention is a method of fabricating a piezoelectric oscillator, wherein laser is applied onto a mass adjustment film on a weight portion provided on an oscillating arm of a tuning fork crystal vibrating piece to partially form a plurality of film removal spots having a diameter matched with a spot diameter of the laser, whereby adjustment is conducted so that a frequency of the tuning fork crystal vibrating piece becomes a target frequency, the method including: a first step wherein a first spot train is formed on the mass adjustment film at a pitch smaller than the diameter of a film removal spot matched with the spot diameter of the laser; and a second step wherein a train space between spot trains is adjusted in accordance with the target frequency of the tuning fork crystal vibrating piece, whereby a second spot train and after are formed.

According to the invention, through the first and second steps: the first step wherein the first spot train is formed on the mass adjustment film at a pitch smaller than the diameter of the film removal spot matched with the spot diameter of laser, and the second step wherein the train space to the first spot train is adjusted in accordance with the target frequency of the tuning fork crystal vibrating piece whereby the spot train after the second train is formed, whereby such a piezoelectric oscillator can be obtained that fine trimming adjustment can be conducted, the frequency is adjusted at high accuracy particularly with no use of an expensive laser trimming apparatus with a small spot diameter.

In addition, in the method of fabricating a piezoelectric oscillator according to the invention, preferably, in the second step, a train space between spot trains is adjusted so that the train space is a space smaller than the diameter of the film removal spot, whereby a second spot train and after are formed.

In this case, in the second step, the train space to the first spot train is adjusted so that the space becomes a space smaller than the diameter of the film removal spot. Thus, finer trimming adjustment can be conducted.

In addition, in the method of fabricating a piezoelectric oscillator according to the invention, preferably, in the first step, laser is applied in such a way that film removal spots in the first spot train are positioned in a tip end area of the mass adjustment film, and a part of each of the film removal spots is extended outward from the tip end area of the mass adjustment film, whereby the film removal spots are formed in a shape partially cut.

In this case, in the first step, laser is applied in such a way that the film removal spots in the first spot train are positioned in the tip end area of the mass adjustment film and formed in a shape partially cut. Thus, finer trimming adjustment can be conducted.

In addition, in the method of fabricating a piezoelectric oscillator according to the invention, preferably, the mass adjustment film of the weight portion is configured of a coarse tuning film to be a weight for coarse tuning, and a fine tuning film to be a weight for fine tuning spaced from the coarse tuning film, on at least one of the coarse tuning film and the fine tuning film, by the first step and the second step, a plurality of spot trains is arranged, the spot train having the film removal spots arranged at a pitch smaller than a diameter thereof, and in the first step, laser is applied in such a way that film removal spots in the first spot train are positioned in a tip end area of at least one of the coarse tuning film and the fine tuning film, and a part of each of the film removal spots is extended outward from the tip end area of the coarse tuning film or fine tuning film, whereby the film removal spots are formed in a shape partially cut.

In this case, in the first step, laser is applied in such a way that the film removal spots in the first spot train are positioned in each of the tip end areas of the coarse tuning film and the fine tuning film configuring the mass adjustment film and formed in a shape partially cut. Thus, finer trimming adjustment can be conducted.

In addition, in the method of fabricating a piezoelectric oscillator according to the invention, in the first and second steps, laser is applied in such a way that among a plurality of spot trains, film removal spots positioned in a side end part thereof are positioned in side edge areas of the mass adjustment film, and a part of each of the film removal spots is extended outward from each of the side edge areas of the mass adjustment film, whereby the film removal spots are formed in a shape partially cut.

In this case, in the first and second steps, laser is applied in such a way that among a plurality of the spot trains, the film removal spots positioned in the side end part are positioned in the side edge area of the mass adjustment film and formed in a shape partially cut. Thus, finer trimming adjustment can be conducted.

In addition, in the method of fabricating a piezoelectric oscillator according to the invention, in the first and second steps, laser is applied in such a way that spot trains of film removal spots are formed on the right and left sides of the mass adjustment film, and each of the spot trains is divided on the right and left sides, and among a plurality of the spot trains divided on the right and left sides, film removal spots positioned at each of side end parts are positioned in each of side edge areas of the mass adjustment film, and a part of each of the film removal spots is extended outward from each of the right and left side edge areas of the mass adjustment film, whereby the film removal spots are formed in a shape partially cut.

In this case, in the first and second steps, laser is applied in such a way that the individual spot trains on the mass adjustment film are divided on the right and left sides, and among a plurality of the spot trains divided on the right and left sides, the film removal spots positioned in each of the side end parts are positioned in each of the right and left side edge areas of the mass adjustment film and formed in a shape partially cut. Thus, finer trimming adjustment can be conducted.

In addition, among the plurality of the spot trains, at least a part of the spot trains is formed in asymmetry with respect to the center axis of the mass adjustment film.

In addition, in the second step, the last spot train is formed in asymmetry with respect to the center axis of the mass adjustment film.

In this case, as compared with the case in which the spot train is formed in bilateral symmetry with respect to the center axis of the mass adjustment film all the time, the degree of freedom of the frequency of the tuning fork crystal vibrating piece adjustment can be increased. Thus, the frequency of the tuning fork crystal vibrating piece can be finely adjusted, and the frequency of the tuning fork crystal vibrating piece can be accurately matched with the target frequency.

In addition, the mass adjustment film is formed on each of right and left oscillating arms of the tuning fork crystal vibrating piece, and the plurality of the spot trains formed on the right and left mass adjustment films is formed in bilateral symmetry with respect to the center axis of the tuning fork crystal vibrating piece.

In addition, the mass adjustment film is formed on each of right and left oscillating arms of the tuning fork crystal vibrating piece, and in the second step, the plurality of the spot trains is formed on the right and left mass adjustment films in bilateral symmetry with respect to the center axis of the tuning fork crystal vibrating piece.

Accordingly, even though the spot train is formed in asymmetry with respect to the center axis of the mass adjustment film, the natural frequency can be matched in the right and left oscillating arms of the tuning fork crystal vibrating piece, and vibration stability can be secured.

In addition, in the second step, the plurality of the spot trains is in turn formed from the first spot train toward the base end side of the tuning fork crystal vibrating piece.

Generally, as the number of spot trains formed on the tip end side of the oscillating arm of the tuning fork crystal vibrating piece increases, the frequency of the tuning fork crystal vibrating piece changes greatly. Thus, a plurality of the spot trains is in turn formed from the first spot train toward the base end side of the tuning fork crystal vibrating piece. Accordingly, in forming the spot train on the tip end side, the frequency can be greatly changed, and the frequency of the tuning fork crystal vibrating piece can be quickly brought close to the target frequency. In addition, in forming the spot train on the base end side of the tuning fork crystal vibrating piece, the frequency can be changed in fractional amounts, and the frequency of the tuning fork crystal vibrating piece can be accurately matched with the target frequency.

In the piezoelectric oscillator according to the invention, the train space between the plurality of the spot trains is set at a space smaller than the diameter of the film removal spot as corresponding to the target frequency of the tuning fork crystal vibrating piece. Thus, such a piezoelectric oscillator can be obtained that trimming is finely adjusted in a high resolution. In other words, with no use of an expensive laser trimming apparatus with a small spot diameter as before, such a piezoelectric oscillator can be obtained that the frequency is close to the target frequency of the tuning fork crystal vibrating piece.

BRIEF DESCRIPTION OF THE DRAWINGS

The teachings of the invention can be readily understood by considering the following detailed description in conjunction with the accompanying drawings, in which.

DESCRIPTION OF THE PREFERRED EMBODIMENT

First Embodiment

Figure 1:
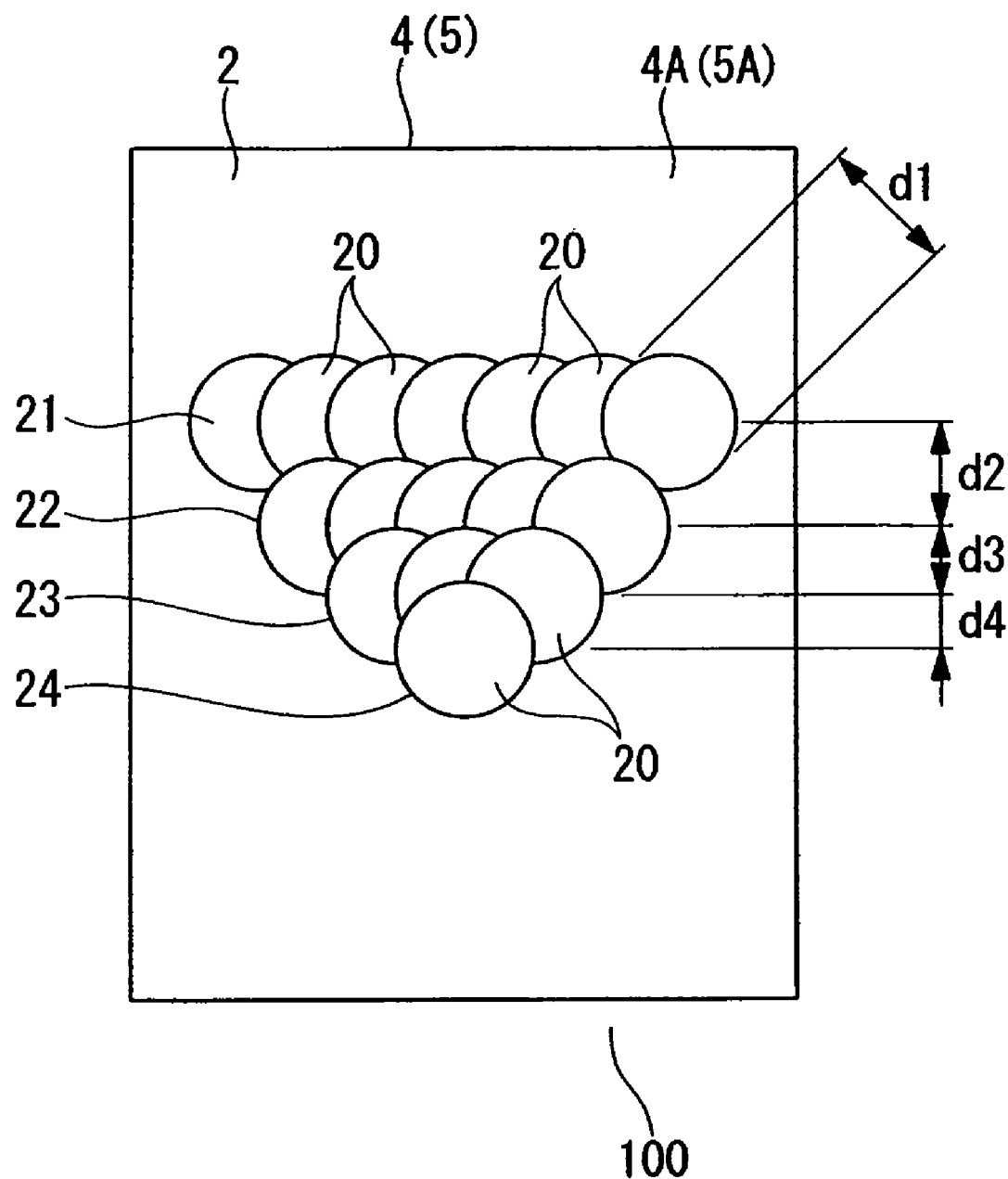
FIG. 1 shows a plan view depicting a method of fabricating a piezoelectric oscillator according to a first embodiment of the invention.
Figure 9:
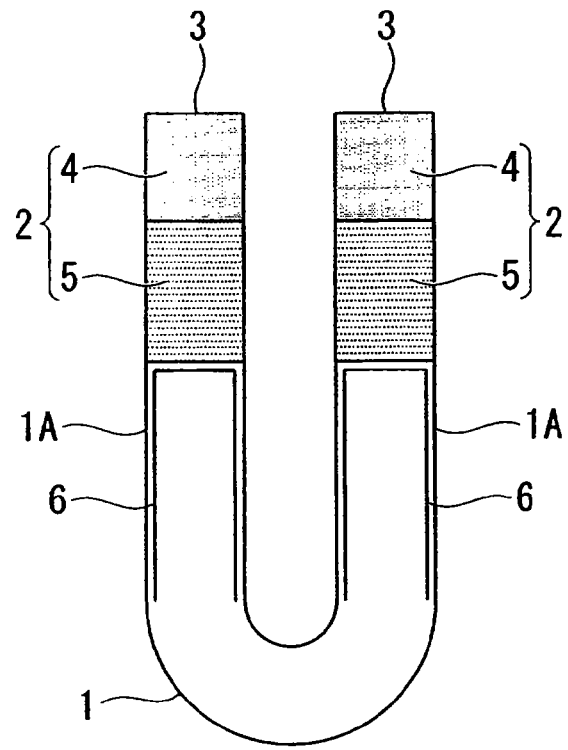
FIG. 9 shows a plan view illustrative of the overall configuration of a conventional tuning fork crystal vibrating piece.
Figure 10:
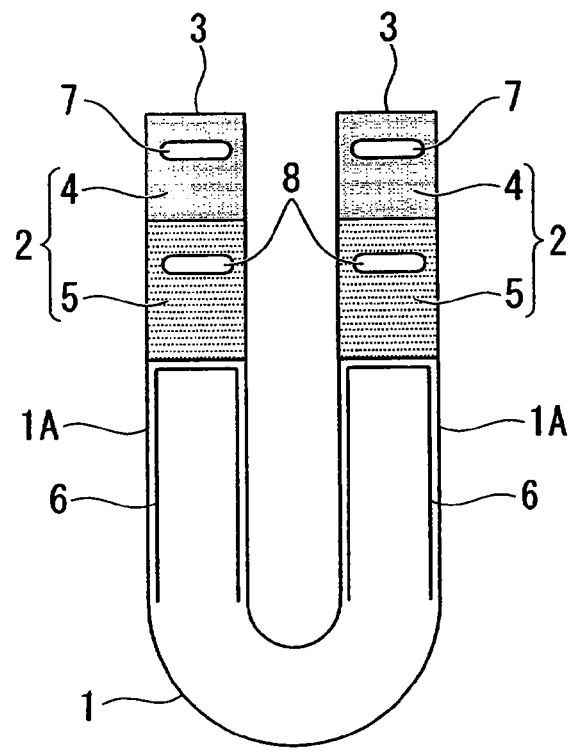
FIG. 10 shows a plan view depicting the case of trimming a deposition film and a sputter film of a conventional tuning fork crystal vibrating piece.
Figure 11:
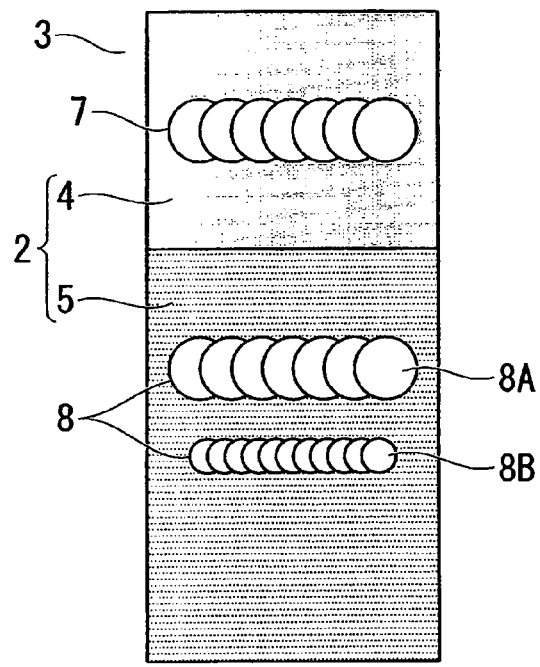
FIG. 11 shows a plan view depicting laser spots for trimming a mass adjustment film of a conventional tuning fork crystal vibrating piece.
Figure 12:
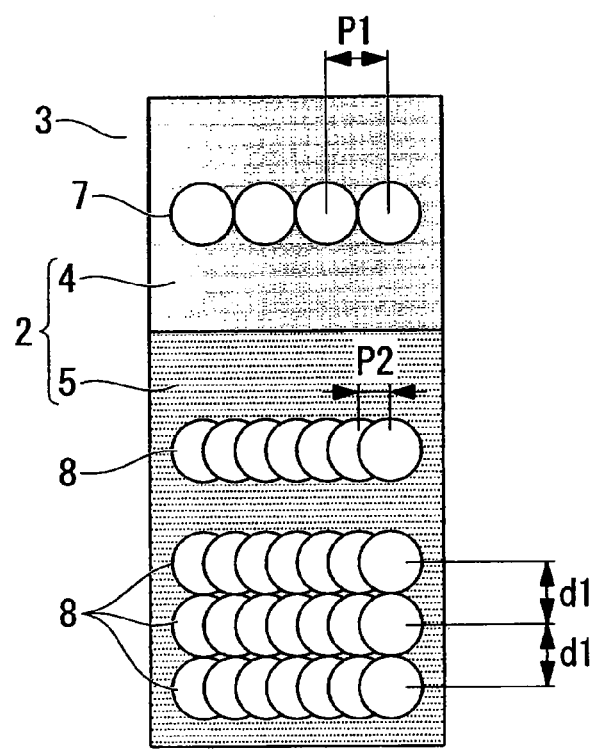
FIG. 12 shows a plan view depicting the pitches of laser spots of a conventional tuning fork crystal vibrating piece.

Hereinafter, a first embodiment of the invention will be described with reference to FIGS. 1 and 2. In addition, a piezoelectric oscillator subject to the trimming process has the same configurations as those shown in FIG. 9, and the same components are designated with the same numerals and signs in order to omit the overlapping descriptions.

Figure 2:
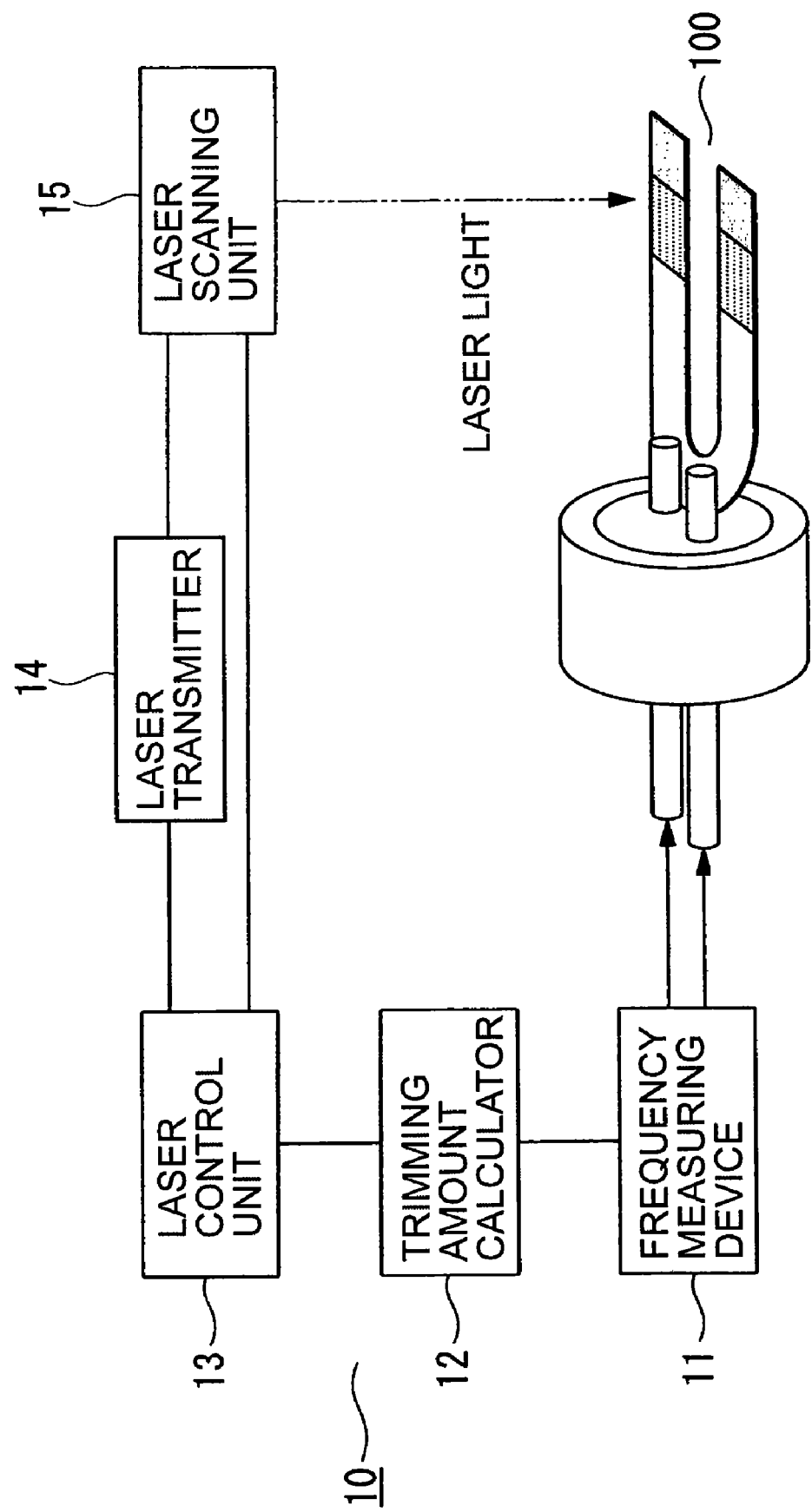
FIG. 2 shows a block diagram schematically depicting a trimming apparatus of a piezoelectric oscillator.

First, a trimming apparatus of a piezoelectric oscillator is shown in FIG. 2 as indicated by a sign 10. The trimming apparatus 10 processes a single to a few tens or greater of piezoelectric oscillators 100 for adjustment targets at the same time. The frequency of these oscillators is measured by a frequency measuring device 11 at the same time, and then the trimming amount and the trimming position of a mass adjustment film 2 is determined by a trimming amount calculator 12 based on a difference between the frequency measured by the frequency measuring device 11 and a predefined target frequency. At this time, the trimming amount calculator 12 gives a trimming instruction to a laser control unit 13 in accordance with the determined value, and the laser control unit 13 controls a laser transmitter 14 and a laser scanning unit 15 to apply a laser beam onto the piezoelectric oscillators to be targets. For a scanning method, there are methods that an X-Y table is used to move the position without changing the incident angle of the laser beam, and that a galvano scanner is used for scanning. However, these methods are well known for omitting the detailed descriptions. In addition, after the trimming apparatus 10 trims the mass adjustment film 2, the frequency measuring device 11 again measures the frequency. Thus, the trimming results are fed back to the trimming amount calculator 12 for conducting the trimming process so that the frequency becomes closer to a predefined target frequency while corrections are repeated. In addition, the trimming apparatus 10 trims a deposition film 4 and a sputter film 5 configuring the mass adjustment film 2.

Then, a method of fabricating a piezoelectric oscillator using the trimming apparatus 10 described above, the method by which the mass adjustment film 2 of the piezoelectric oscillator 100 for an adjustment target can be finely trimmed in a high resolution, will be described with reference to FIG. 1. In the trimming apparatus 10, laser is applied to the mass adjustment film 2 provided on an oscillating arm 1A of a tuning fork crystal vibrating piece 1, whereby a plurality of film removal spots having the diameter matched with the spot diameter of laser (indicated by signs 20) is partially formed for adjustment so that the frequency of the tuning fork crystal vibrating piece 1 becomes the target frequency. At this time, first, on the mass adjustment film 2, a first spot train (indicated by a sign 21) is formed at a pitch smaller than the diameter of a film removal spot 20 matched with the spot diameter of laser (first step). After that, the trimming amount calculator 12 again calculates the trimming amount, and a train space (d) between spot trains is determined so as to match with the target frequency of the tuning fork crystal vibrating piece 1.

Then, based on the determined train space (d), a second spot train 22 and spot trains 23 and 24 after the second spot train are formed (second step).

In other words, in the second step described above, the train spaces (d2 to d4) between the spot trains are adjusted so that the spaces are a space smaller than the diameter (d1) of the film removal spot 20, whereby the second spot train 22 and the spot trains 23 and 24 after the second spot train are formed. At this time, as the difference from the target frequency becomes smaller, the train spaces (d2 to d4) between the spot trains 21 to 24 are narrowed step by step. More specifically, when the diameter of the film removal spot 20 is d1, the space (d2) between the first spot train 21 and the second spot train 22 is made smaller than the diameter (d1) of the film removal spot 20, the space (d3) between the subsequent second spot train 22 and the third spot train 23 is made smaller than the space (d2) between the spot trains 21 and 22, and the space (d4) between the subsequent third spot train 23 and the fourth the spot train 24 is made smaller than the space (d3) between the spot trains 22 and 23. In other words, the relationship "d1>d2>d3>d4" is established, whereby the mass adjustment film 2 is finely removed step by step, and the resolution of trimming is gradually increased.

As discussed in detail above, in the method of fabricating a piezoelectric oscillator described in the first embodiment, in turn through the first and second steps: the first step in which the first spot train 21 is formed on the mass adjustment film 2 at a pitch smaller than the diameter of the film removal spot 20 matched with the spot diameter of laser, and the second step in which the train space to the first spot train 21 is adjusted in accordance with the target frequency of the tuning fork crystal vibrating piece 1 to form the second spot train 22 and the spot trains 23 and 24 after the second spot train, fine trimming adjustment can be conducted. Such a piezoelectric oscillator can be obtained that the frequency is adjusted at high accuracy particularly with no use of an expensive laser trimming apparatus with a small spot diameter. Then, in the piezoelectric oscillator thus fabricated, a plurality of the spot trains 21 to 24 having the film removal spots 20 arranged at a pitch (p2) smaller than the diameter (p1) thereof is provided on the mass adjustment film 2, and the train spaces (d2 to d4) between a plurality of the spot trains 22 to 24 is set at the space smaller than the diameter of the film removal spot 20 as corresponding to the target frequency of the tuning fork crystal vibrating piece 1. Thus, the space settings of the spot trains 21 to 24 can adjust trimming highly precisely.

In addition, the trimming scheme described above in which the train spaces between the spot trains 21 to 24 are in turn narrowed may be conducted on both of the deposition film 4 and the sputter film 5 configuring the mass adjustment film 2 of the weight portion 3, or may be conducted on any one of the deposition film 4 and the sputter film 5. The selection can be made freely.

Second Embodiment

Figure 3:
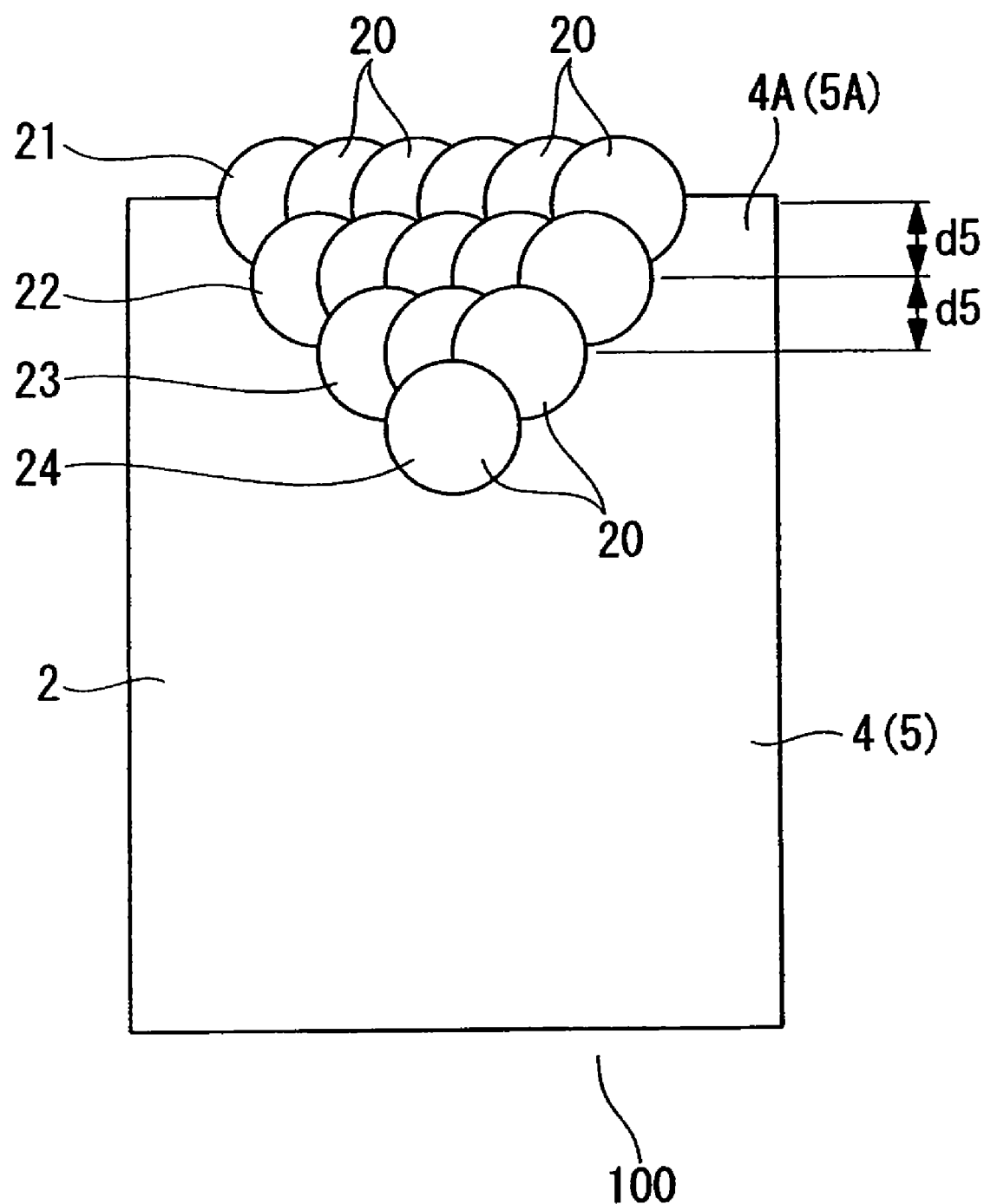
FIG. 3 shows a plan view depicting the method of fabricating a piezoelectric oscillator according to a second embodiment of the invention.

Next, a second embodiment of the invention will be described with reference to FIGS. 3 and 4. As shown in FIG. 3, the trimming described in the second embodiment is different from the trimming described in the first embodiment is in that laser is partially applied onto a tip end area 4A (5A) in such a way that the first spot train 21 formed in the first step is positioned in the tip end area of the mass adjustment film 2 (the area indicated by signs 4A and 5A), and a part of each of the film removal spots 20 is extended outward from the tip end area of the mass adjustment film 2, whereby the film removal spots 20 are formed in a shape partially cut. In other words, based on a trimming instruction from the trimming amount calculator 12 to the laser control unit 13, laser is applied onto the tip end area 4A (5A) of the mass adjustment film 2 in such a way that the film removal spot 20 is about a half, thereby forming the first spot train 21 formed of the film removal spots 20 in a half circle.

In addition, to what extent the film removal spot 20 is formed in the tip end area 4A (5A) of the mass adjustment film 2 (that is, the ratio of the size of the half circle) can be freely determined depending on how finely trimming is conducted. In addition, laser application to form the film removal spots 20 in a shape partially cut may be conducted in the tip end area 4A of the deposition film 4 for coarse tuning positioned in the upper part of the mass adjustment film 2 as well as in the tip end area 5A of the sputter film 5 for a weight for fine tuning. In this case, as shown in FIG. 4, a gap is formed between the deposition film 4 and the sputter film 5 forming the mass adjustment film 2 of the weight portion 3 (the gap indicated by a sign 25), and this gap 25 is used to conduct laser application to form the film removal spots 20 in a shape partially cut in the tip end area 5A of the sputter film 5.

In addition, a train space (d5) between the spot trains 21 to 24 is set to be a space smaller than the diameter (d1) of the film removal spot 20. At this time, as similar to the first embodiment, the train spaces between the spot trains 21 to 24 are narrowed step by step as the signs d2 to d4.

As discussed in detail above, in the method of fabricating a piezoelectric oscillator described in the second embodiment, in the first step, laser is applied in such a way that the first spot train 21 is positioned in the tip end area (4A/5A) of the deposition film 4 and the sputter film 5 configuring the mass adjustment film 2 of the weight portion 3, and a part of each of the film removal spots 20 is extended outward from the tip end area of the mass adjustment film, whereby the film removal spots 20 is formed in a shape partially cut. Thus, fine trimming adjustment can be conducted, and such a piezoelectric oscillator can be obtained that the frequency is adjusted at high accuracy particularly with no use of an expensive laser trimming apparatus with a small spot diameter. Then, in the piezoelectric oscillator thus fabricated, a plurality of the spot trains 21 to 24 having the film removal spots 20 arranged at a pitch (p2) smaller than the diameter (p1) thereof is provided on the mass adjustment film 2, and among a plurality of the spot trains 21 to 24, the film removal spots 20 in the first spot train 21 is positioned in the tip end area of the mass adjustment film 2, and formed in a shape partially cut. Thus, the ratio of partially cutting the film removal spots 20 is properly determined in the first spot train 21, whereby trimming can be adjusted highly precisely.

Figure 4:
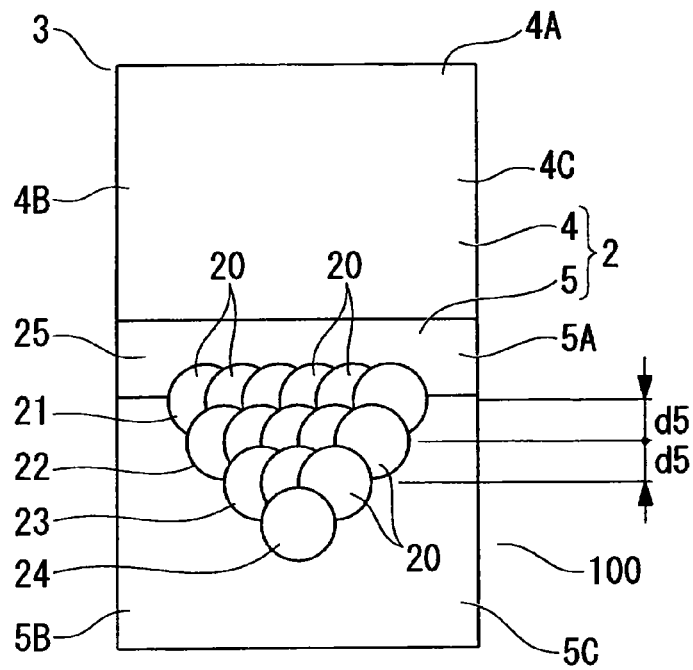
FIG. 4 shows a plan view depicting a modification shown in FIG. 2.

In addition, the trimming scheme described above in which the film removal spots 20 in the spot train 21 are partially cut may be conducted on both of the deposition film 4 and the sputter film 5 configuring the mass adjustment film 2 of the weight portion 3, as shown in FIGS. 3 and 4, or may be conducted on any one of the deposition film 4 and the sputter film 5. The selection can be made freely.

Third Embodiment

Figure 5:
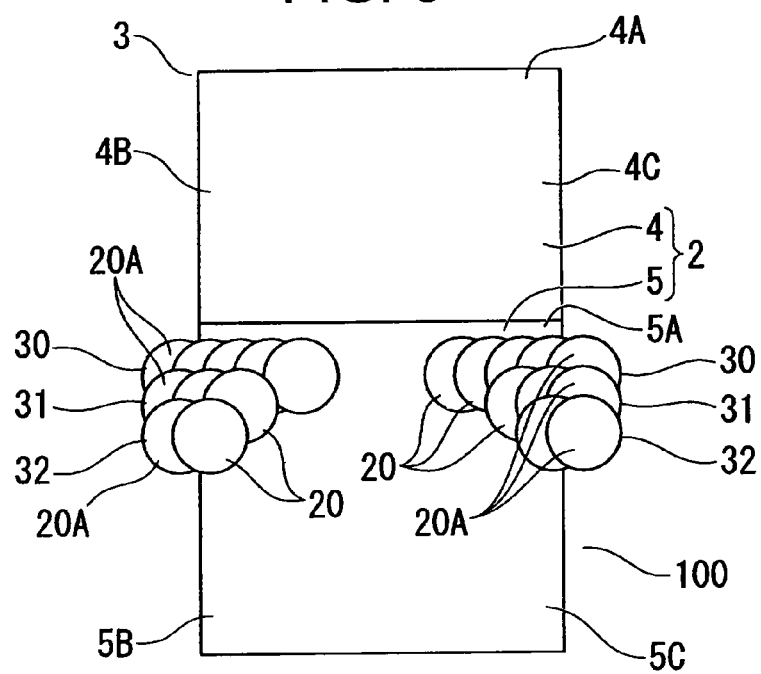
FIG. 5 shows a plan view depicting a method of fabricating a piezoelectric oscillator according to a third embodiment of the invention.

Next, a third embodiment of the invention will be described with reference to FIG. 5. The trimming described in the third embodiment is different from the second embodiment in which the film removal spots 20 configuring the first spot train 21 are partially cut, in that the film removal spots 20 positioned in the side end parts of a plurality of the spot trains 21 to 24 are partially cut. In other words, in the trimming in the third embodiment, as shown in FIG. 5, in the first and second steps described above, laser is partially applied onto each of the side edge areas (signs 4B, 4C, 5B, and 5C) in such a way that spot trains 30 to 32 formed of the film removal spots 20 are divided and arranged on the right and left sides of the mass adjustment film 2 of the weight portion 3, and among a plurality of the spot trains 30 to 32 divided on the right and left sides, a part of each of the film removal spots 20 (indicated by a sign 20A) positioned in each of the side end parts is extended outward from the side edge area of the mass adjustment film 2, whereby the film removal spots 20 are formed in a shape partially cut in each of the side edge areas of the mass adjustment film 2 (signs 4B, 4C, 5B, and 5C).

As discussed in detail above, in the method of fabricating a piezoelectric oscillator described in the third embodiment, in the first and second steps, laser is applied in such a way that the spot trains 30 to 32 formed of the film removal spots 20 are divided and arranged on the right and left sides on the mass adjustment film 2, and among a plurality of the spot trains 30 to 32 divided on the right and left sides, the film removal spots 20 (indicated by a sign 20A) positioned in each of the side end parts are formed in a shape partially cut in each of the side edge areas on the right and left sides of the mass adjustment film 2 (signs 4B, 4C, 5B, and 5C). Thus, as similar to the second embodiment, fine trimming adjustment can be conducted, and such a piezoelectric oscillator can be obtained that the frequency is adjusted at high accuracy particularly with no use of an expensive laser trimming apparatus with a small spot diameter. Then, in the piezoelectric oscillator thus fabricated, a plurality of the spot trains 30 to 32 having the film removal spots 20 arranged at a pitch (p2) smaller than the diameter (p1) thereof is provided on the mass adjustment film 2, and among a plurality of the spot trains 30 to 32, the film removal spots 20 (20A) positioned in the side end part are positioned in the side edge areas of the mass adjustment film 2 (signs 4B, 4C, 5B, and 5C), and formed in a shape partially cut. Therefore, the ratio of partially cutting the film removal spot is properly determined, whereby trimming can be adjusted highly precisely.

In addition, the trimming scheme described above in which the film removal spots 20 (20A) positioned in the side end part of the spot trains 30 to 32 are partially cut may be conducted on both of the deposition film 4 and the sputter film 5 configuring the mass adjustment film 2 of the weight portion 3, or may be conducted on any one of the deposition film 4 and the sputter film 5. The selection can be made freely.

In addition, as described above, the spot trains 30 to 32 formed of the film removal spots 20 are divided and arranged on the right and left sides, and are uniformly arranged on both sides of the mass adjustment film 2 in good balance, whereby the vibration performance of the piezoelectric oscillator is made excellent. However, as described above, the trimming in which the film removal spots 20 (20A) positioned in the side end part of the spot train are partially cut may be conducted to the spot trains 21 to 24 shown in FIGS. 1, 3, and 4 at the same time. The selection can be made freely.

Figure 6:
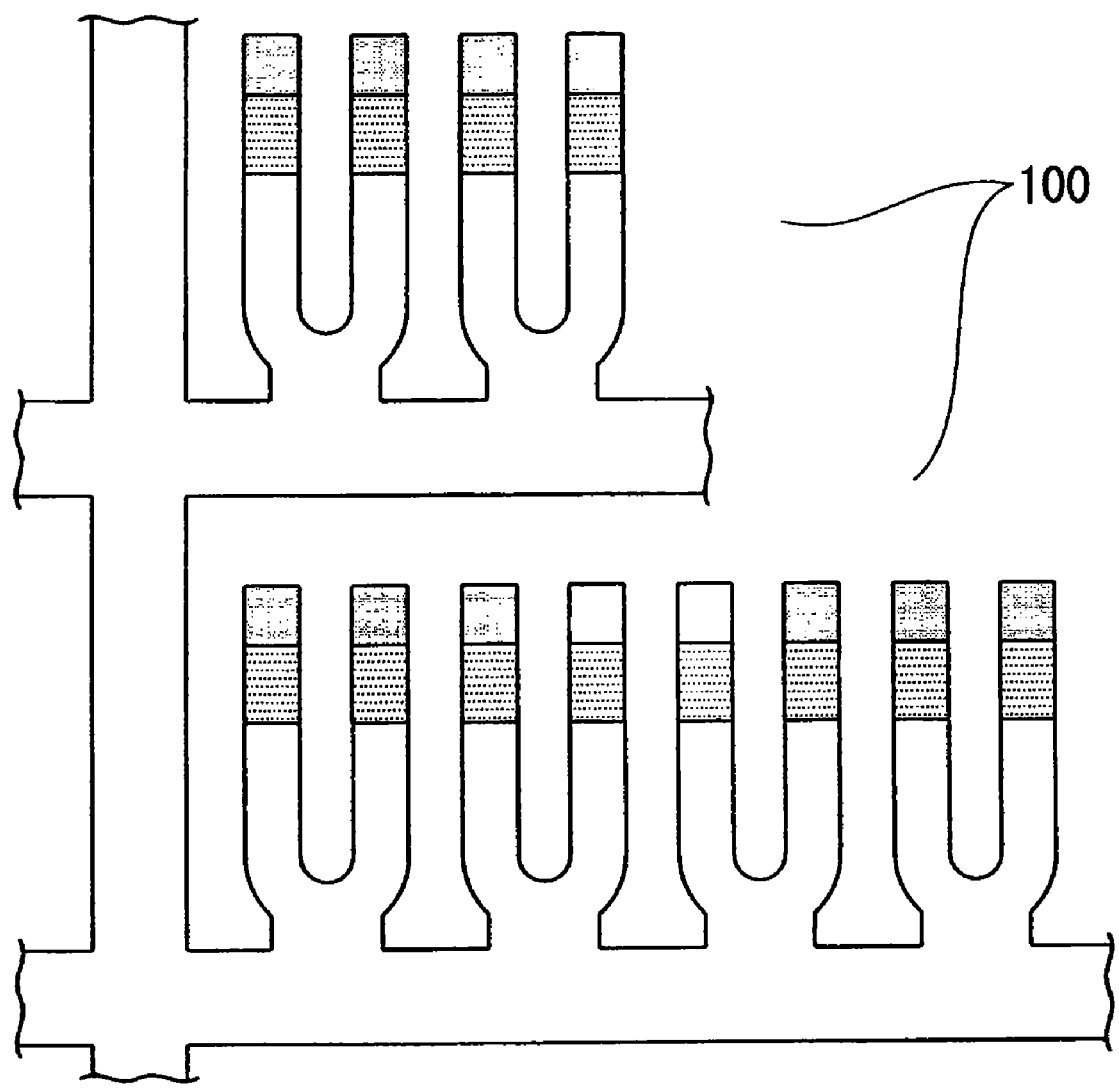
FIG. 6 shows a plan view depicting piezoelectric oscillators in a wafer state.
Figure 7:
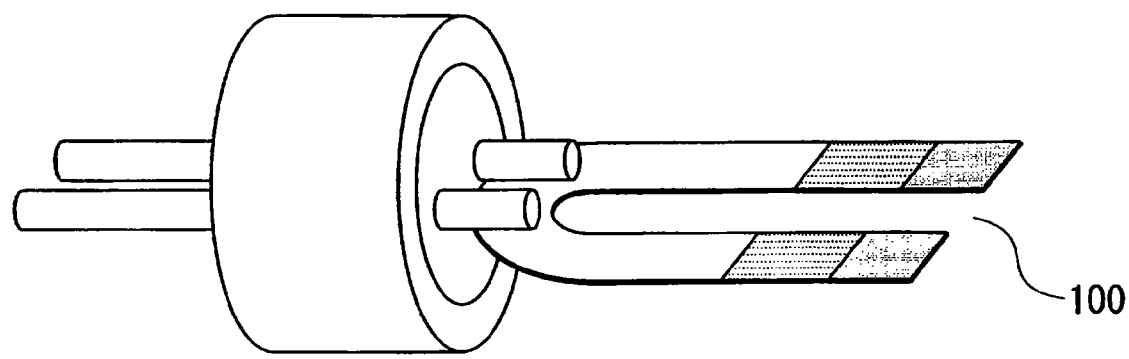
FIG. 7 shows a perspective view depicting a cylinder piezoelectric device.
Figure 8:
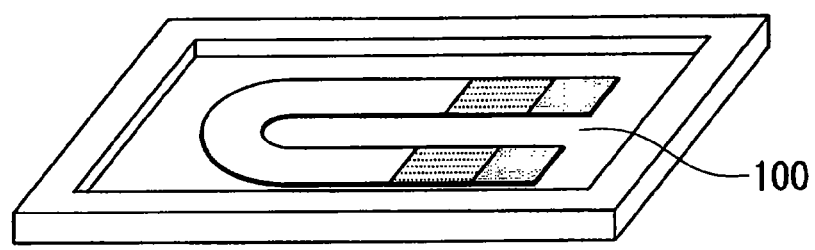
FIG. 8 shows a perspective view depicting a surface mounting type piezoelectric device.

In addition, as the piezoelectric oscillator 100 to be a trimming target described in the first to third embodiments, the piezoelectric oscillators 100 are formed in a wafer before separated from each other as shown in FIG. 6, in a cylinder type shown in FIG. 7, and in a surface mounting type mounted on a ceramic case as shown in FIG. 8. Then, in the piezoelectric oscillator 100 shown in FIG. 6, coarse tuning of the frequency is conducted as the piezoelectric oscillators 100 are formed on the wafer. At this time, while the oscillation frequency of a single to a plurality of the piezoelectric oscillators 100 is measured, a laser beam is applied onto the deposition film 4 of the coarse tuning portion on which Au is deposited for trimming the weight portion 3, whereby the frequency is adjusted. In addition, the piezoelectric oscillator having been subjected to coarse tuning is formed in a cylinder type mounted on a plug as shown in FIG. 7, or in a surface mounting type as shown in FIG. 8 in which the base part of the piezoelectric oscillator is separated from the wafer, and the piezoelectric oscillator is placed into a surface mounting case, and sealed with a ceramic, quartz crystal, or glass case with a window through which the laser beam is transmitted in the vacuum state. Then, the sputter film 5 that is the fine tuning portion is trimmed in the mounted state as shown in FIGS. 7 and 8. In trimming the deposition film 4 of the coarse tuning portion and the sputter film 5 of the fine tuning portion, the schemes described in the first to third embodiments are used.

Fourth Embodiment

Figure 13:
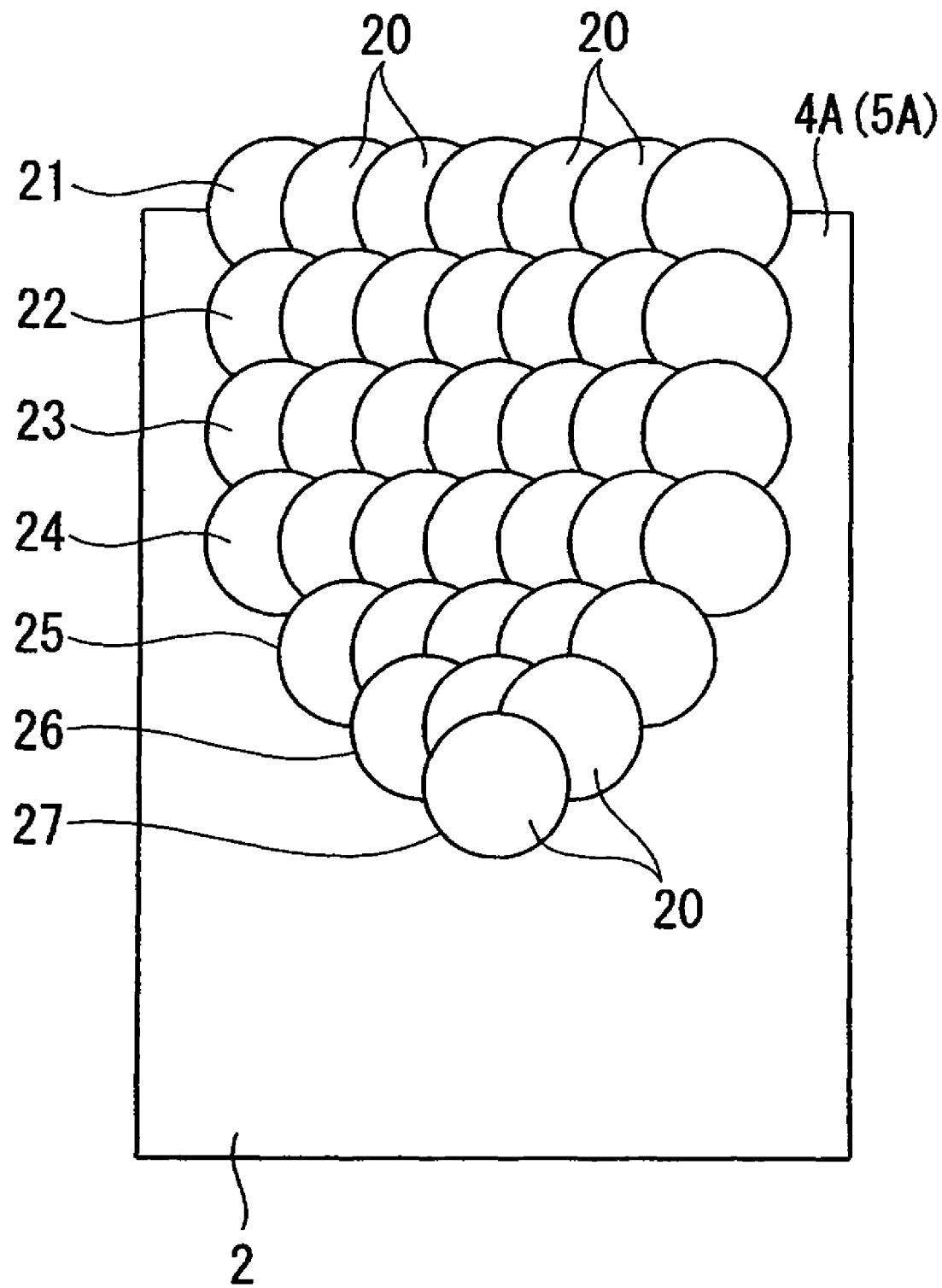
FIG. 13 shows a plan view depicting a method of fabricating a piezoelectric oscillator according to a fourth embodiment of the invention.

Next, a fourth embodiment of the invention will be described with reference to FIG. 13. In the second embodiment shown in FIG. 3, the length of all the spot trains 21 to 24 is formed in turn shorter. However, the fourth embodiment shown in FIG. 13 is different in that the length of the spot trains 21 to 24 at the tip end side of the tuning fork crystal vibrating piece is formed the same. In addition, for the components having similar configurations as those in the each of the embodiments, the detailed descriptions will be omitted.

In the fourth embodiment, a plurality of spot trains 21 to 27 having the film removal spots 20 arranged at a pitch smaller than the diameter thereof is formed on the mass adjustment film 2 (for example, seven trains). The train space between a plurality of the spot trains 21 to 27 is arranged at the space smaller than the diameter of the film removal spot 20, and adjusted in accordance with the target frequency of the tuning fork crystal vibrating piece.

Among a plurality of the spot trains 21 to 27, the film removal spots 20 in the first spot train 21 formed in the first step are positioned in the tip end area of the mass adjustment film 2 (the area indicated by signs 4A and 5A), and a part of each of the film removal spots 20 is extended outward from the tip end area of the mass adjustment film 20, whereby the film removal spots 20 are formed in a shape partially cut.

Among a plurality of the spot trains 21 to 27, the spot trains 21 to 24 at the tip end side of the tuning fork crystal vibrating piece are formed to have the same length. In the embodiment, the length of the first spot trains 21 to the fourth spot train 24 is formed in the same length. The length of the spot trains 21 to 24 is formed equal to the width of the mass adjustment film 2, for example. By the spot trains 21 to 24, the mass adjustment film 2 is trimmed nearly in a rectangular shape as seen in plane.

On the other hand, among a plurality of the spot trains 21 to 27, the length of the spot trains 25 to 27 on the base end side of the tuning fork crystal vibrating piece is formed in turn shorter. In the embodiment, the length of the fourth spot trains 25 to the seventh spot train 27 is formed in turn shorter. For example, the last spot train 27 (on the most base end side) is formed of a single film removal spot 20. By the spot trains 25 to 27, the mass adjustment film 2 is trimmed nearly in a triangle shape as seen in plane. In addition, the spot trains 25 to 27 may be formed in various shapes other than in a nearly triangle shape.

In the embodiment, when the frequency of the tuning fork crystal vibrating piece is adjusted, the spot trains 21 to 24 on the tip end side are first formed so that the frequency of the tuning fork crystal vibrating piece can be brought close to the target frequency. Here, the spot trains 21 to 24 on the tip end side are formed in the same length, whereby the mass adjustment film 2 can be trimmed greatly, and the frequency of the tuning fork crystal vibrating piece can be quickly brought close to the target frequency.

Subsequently, the spot trains 25 to 27 on the base end side are formed so that the frequency of the tuning fork crystal vibrating piece can be matched with the target frequency. Here, the length of the spot trains 25 to 27 on the base end side is formed in turn shorter, whereby the mass adjustment film 2 can be trimmed in fractional amounts, and the frequency of the tuning fork crystal vibrating piece can be accurately matched with the target frequency.

As discussed above, even though the frequency of the tuning fork crystal vibrating piece is off from the target frequency, the frequency can be quickly, accurately matched with the target frequency.

Fifth Embodiment

Figure 14:
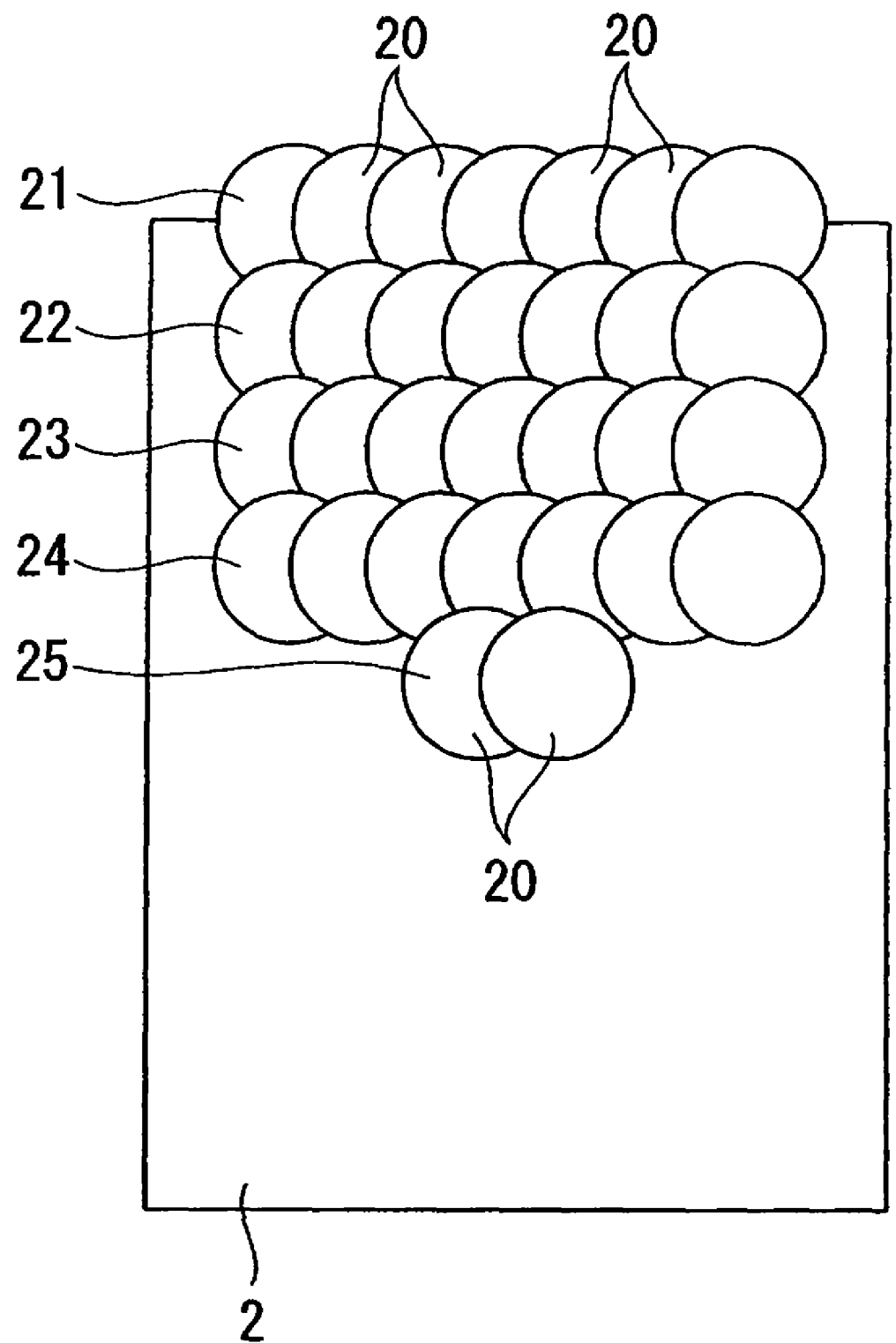
FIG. 14 shows a plan view depicting a method of fabricating a piezoelectric oscillator according to a fifth embodiment of the invention.

Next, a fifth embodiment of the invention will be described with reference to FIG. 14. In the fourth embodiment shown in FIG. 13, the length of the spot trains 25 to 27 on the base end side is formed in turn shorter. However, the fifth embodiment shown in FIG. 14 is different in that only the last spot train 25 (on the most base end side) is formed shorter than the other spot trains 21 to 24. In addition, for the components having similar configurations as those in the each of the embodiments, the detailed descriptions will be omitted.

Among a plurality of the spot trains 21 to 25, the spot trains 21 to 24 other than the last train are formed to have the same length. In the embodiment, the length of the first spot trains 21 to the fourth spot train 24 is formed in the same length. The length of the spot trains 21 to 24 is formed equal to the width of the mass adjustment film 2, for example. By the spot trains 21 to 24, the mass adjustment film 2 is trimmed nearly in a rectangular shape as seen in plane.

On the other hand, the length of the last spot train 25 is formed shorter than that of the other spot trains 21 to 24. For example, the first spot trains 21 to the fourth spot train 24 are formed of six film removal spots 20, whereas the last spot train 25 is formed of two film removal spots 20.

In the embodiment, when the frequency of the tuning fork crystal vibrating piece is adjusted, a plurality of the spot trains 21 to 24 is first formed so that the frequency of the tuning fork crystal vibrating piece can be brought closest to the target frequency. Here, a plurality of the spot trains 21 to 24 is formed in the same length, whereby the mass adjustment film 2 can be trimmed greatly, and the frequency of the tuning fork crystal vibrating piece can be quickly brought close to the target frequency.

Subsequently, the last spot train 25 is formed so that the frequency of the tuning fork crystal vibrating piece can be matched with the target frequency. Here, the last spot train 25 is formed shorter than the other spot trains 21 to 24, whereby the mass adjustment film 2 can be trimmed in a slight amount, and the frequency of the tuning fork crystal vibrating piece can be accurately matched with the target frequency.

As discussed above, even though the frequency of the tuning fork crystal vibrating piece is off from the target frequency, the frequency can be quickly, accurately matched with the target frequency.

Sixth Embodiment

Figure 15:
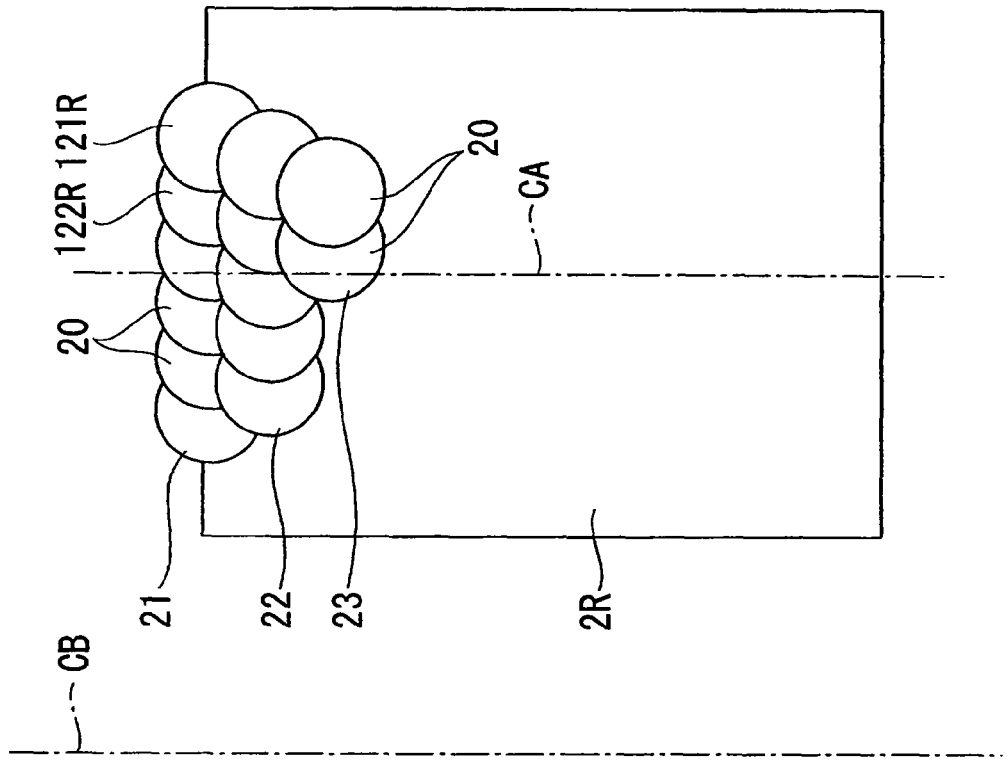
FIG. 15 shows a plan view depicting a method of fabricating a piezoelectric oscillator according to a sixth embodiment of the invention.
Figure 15:
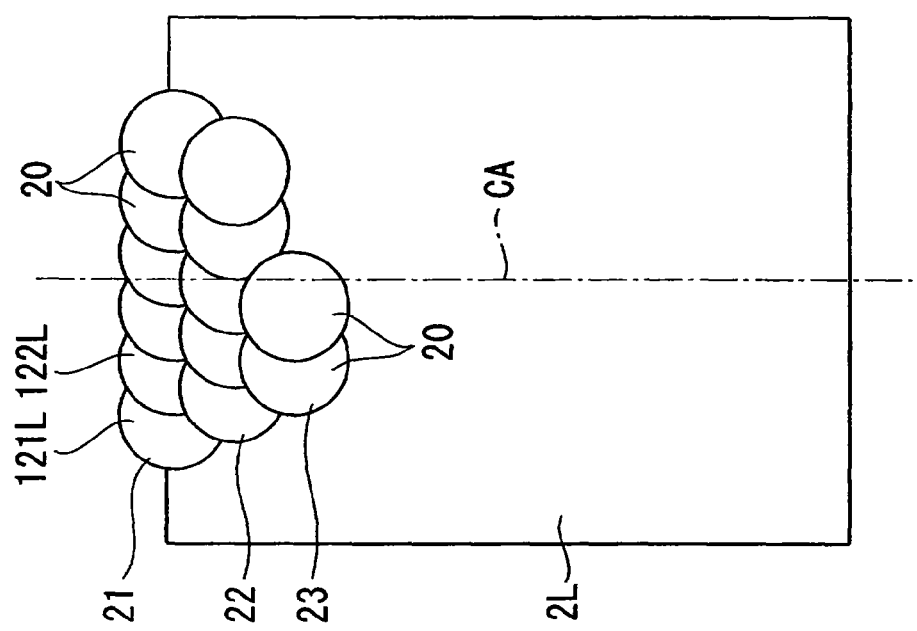

Next, a sixth embodiment of the invention will be described with reference to FIG. 15. In addition, in FIG. 15, a mass adjustment film 2R provided on the right oscillating arm and a mass adjustment film 2L provided on the left oscillating arm in a piezoelectric vibrating piece seen in plane are shown side by side. In the second embodiment shown in FIG. 3, all the spot trains 21 to 24 are formed in bilateral symmetry with respect to the center axis of the mass adjustment film 2. However, the sixth embodiment shown in FIG. 15 is different in that the last spot train 23 is formed in asymmetry with respect to a center axis CA of the mass adjustment film 2. In addition, for the components having similar configurations as those in the each of the embodiments, the detailed descriptions will be omitted.

In the sixth embodiment, the spot trains 21 and 22 other than the last train are formed in bilateral symmetry with respect to the center axis CA of the mass adjustment film 2, whereas the last spot train 23 is formed in asymmetry with respect to the center axis of CA. For example, the first spot train 21 formed of six film removal spots 20 and the second spot train 22 formed of five film removal spots 20 are formed in bilateral symmetry with respect to the center axis CA of the mass adjustment film 2. However, the last spot train 23 formed of two film removal spots 20 is formed too far to one side of the right and left sides.

However, the last spot train 23 in the right mass adjustment film 2R and the last spot train 23 in the left mass adjustment film 2L are formed in bilateral symmetry with respect to a center axis CB of the tuning fork crystal vibrating piece. For example, the last spot train 23 in the right mass adjustment film 2R is formed too far to the right side of the mass adjustment film 2R, whereas the last spot train 23 in the left mass adjustment film 2L is formed too far to the left side of the mass adjustment film 2L.

In the embodiment, when the frequency of the tuning fork crystal vibrating piece is adjusted, a plurality of the spot trains 21 to 23 is first formed so that the frequency of the tuning fork crystal vibrating piece can be brought close to the target frequency. Generally, as the number of film removal spots 20 formed on the tip end side of the oscillating arm of the tuning fork crystal vibrating piece increases, the frequency of the tuning fork crystal vibrating piece changes greatly. Thus, desirably, the spot train is in turn formed from the tip end side (the first spot train 21) toward the base end side (the last spot train 23). Therefore, in forming the spot train on the tip end side, the frequency can be greatly changed, and the frequency of the tuning fork crystal vibrating piece can be quickly brought close to the target frequency. In addition, in forming the spot train on the base end side, the frequency can be changed in fractional amounts, and the frequency of the tuning fork crystal vibrating piece can be accurately matched with the target frequency.

Then, at the point in time at which the frequency of the tuning fork crystal vibrating piece is matched with the target frequency, the formation of the film removal spots 20 is stopped. At this time, it is unnecessary to continue to form the film removal spots 20 until the last spot train 23 is formed in bilateral symmetry with respect to the center axis CA of the mass adjustment film 2. It is sufficient that the formation of the film removal spots 20 is stopped in the asymmetric state with respect to the center axis of CA. In this case, as compared with the case in which the spot train is formed in bilateral symmetry with respect to the center axis CA of the mass adjustment film 2 all the time, the degree of freedom of the frequency adjustment of the tuning fork crystal vibrating piece can be increased. Thus, the frequency of the tuning fork crystal vibrating piece can be finely adjusted, and the frequency of the tuning fork crystal vibrating piece can be accurately matched with the target frequency.

Here, when the last spot train 23 is in asymmetry with respect to the center axis CA of the mass adjustment film 2, the balance in the oscillating arm is lost. When the balance is lost, the natural frequency is varied in the right and left oscillating arms of the tuning fork crystal vibrating piece, which degrades vibration stability. In addition, it can be considered that such a phenomenon occurs in which the resonance point of oscillator oscillation fluctuates between the arms because of the influence of the oscillating arms having different natural frequencies. Moreover, because the moment generated by vibrations generally canceled by the right and left oscillating arms of the tuning fork crystal vibrating piece escapes as the energy that vibrates the entire tuning fork crystal vibrating piece, the vibration properties are affected, and it becomes slightly difficult to vibrate.

Then, desirably, the spot trains 21 to 23 on the right mass adjustment film 2R and the spot trains 21 to 23 on the left mass adjustment film 2L are formed in bilateral symmetry with respect to the center axis CB of the tuning fork crystal vibrating piece. More specifically, a plurality of the film removal spots 20 is formed in bilateral symmetry with respect to the center axis CB of the tuning fork crystal vibrating piece all the time in such a way that first film removal spots 121R and 121L are first formed on the right and left mass adjustment films 2R and 2L, and second film removal spots 122R and 122L are then formed.

Thus, when the frequency of the tuning fork crystal vibrating piece is matched with the target frequency and the formation of the film removal spots 20 is stopped, even though the last spot train 23 is in asymmetry with respect to the center axis CA of the mass adjustment film 2, the last spot trains 23 on the right and left mass adjustment films 2R and 2L are in bilateral symmetry with respect to the center axis CB of the tuning fork crystal vibrating piece. Accordingly, the natural frequency can be matched in the right and left oscillating arms of the tuning fork crystal vibrating piece, and vibration stability can be secured.

What is claimed is:

1. A piezoelectric oscillator comprising:
a weight portion having a mass adjustment film laminated on an oscillating arm of a tuning fork crystal vibrating piece,
wherein the weight portion comprises a plurality of film removal spots in which the mass adjustment film is partially removed as corresponding to a spot diameter by laser application, whereby adjustment is conducted so that a frequency of the tuning fork crystal vibrating piece becomes a target frequency,
wherein on the mass adjustment film, a plurality of spot trains is arranged in a row, a spot train having the plurality of film removal spots arranged such that a pitch between two neighboring film removal spots is smaller than a diameter of a film removal spot, and
a train space between two adjacent rows of the plurality of the spot trains arranged at a space smaller than the diameter of the film removal spot, the train space being adjusted in accordance with the target frequency of the tuning fork crystal vibrating piece.

2. The piezoelectric oscillator according to claim 1, wherein among the plurality of the spot trains, at least a part of the spot trains is formed in asymmetry with respect to the center axis of the mass adjustment film.

3. The piezoelectric oscillator according to claim 1, wherein the mass adjustment film is formed on each of right and left oscillating arms of the tuning fork crystal vibrating piece, and
the plurality of the spot trains formed on the right and left mass adjustment films is formed in bilateral symmetry with respect to the center axis of the tuning fork crystal vibrating piece.

4. A piezoelectric oscillator comprising:
a weight portion having a mass adjustment film laminated on an oscillating arm of a tuning fork crystal vibrating piece,
wherein the weight portion comprises a plurality of film removal spots in which the mass adjustment film is partially removed as corresponding to a spot diameter by laser application, whereby adjustment is conducted so that a frequency of the tuning fork crystal vibrating piece becomes a target frequency,
wherein on the mass adjustment film, a plurality of spot trains is arranged in a row, a spot train having the plurality of film removal spots arranged such that a pitch between two neighboring film removal spots is smaller than a diameter of a film removal spot, and
wherein film removal spots in a first row of the plurality of spot trains are positioned in a tip end area of the mass adjustment film, and the film removal spots in the first row has a shape of being partially cut as a part of the film removal spots in the first row has been extended outward from the tip end area of the mass adjustment film and removed.

5. The piezoelectric oscillator according to claim 4,
wherein the mass adjustment film of the weight portion comprises a coarse tuning film to be a weight for coarse tuning, and a fine tuning film to be a weight for fine tuning spaced from the coarse tuning film, and
on at least one of the coarse tuning film and the fine tuning film, the plurality of spot trains is arranged in a row, and
among the plurality of the spot trains, the film removal spots in the first row of the plurality of spot trains are positioned in a tip end area of at least one of the coarse tuning film and the fine tuning film.

6. A piezoelectric oscillator comprising:
a weight portion having a mass adjustment film laminated on an oscillating arm of a tuning fork crystal vibrating piece, wherein the weight portion comprises a plurality of film removal spots in which the mass adjustment film is partially removed as corresponding to a spot diameter by laser application, whereby adjustment is conducted so that a frequency of the tuning fork crystal vibrating piece becomes a target frequency,
wherein on the mass adjustment film, a plurality of spot trains is arranged in a row, a spot train having the plurality of film removal spots arranged such that a pitch between two neighboring film removal spots is smaller than a diameter of a film removal spot, and
wherein a part of the plurality of film removal spots are positioned in a side edge area of the mass adjustment film, and the part of the film removal spots has a shape of being partially cut as another part of the film removal spots has been extended outward from a side edge area of the mass adjustment film and cut.

7. The piezoelectric oscillator according to claim 6,
wherein the individual spot trains are divided and arranged on the right and left sides on the mass adjustment film, and
the part of the film removal spots arranged in the individual spot trains have a shape of being partially cut as another part of the film removal spots has been extended outward from each of the right and left side edge areas of the mass adjustment film and cut.

8. A method of fabricating a piezoelectric oscillator, wherein laser is applied onto a mass adjustment film on a weight portion provided on an oscillating arm of a tuning fork crystal vibrating piece to partially form a plurality of film removal spots having a diameter matched with a spot diameter of the laser, whereby adjustment is conducted so that a frequency of the tuning fork crystal vibrating piece becomes a target frequency, the method comprising:
a first step of forming one row of a spot train on the mass adjustment film by arranging at least two neighboring film removal spots at a pitch smaller than the diameter of a film removal spot matched with the spot diameter of the laser;
a second step of determining a train space between two adjacent spot trains in accordance with the target frequency of the tuning fork crystal vibrating piece;
a third step of forming a next row of a spot train which is arranged to be spaced from the one row of the spot train by the determined train space; and
a fourth step of adjusting the train space in accordance with the target frequency of the tuning fork crystal vibrating piece; and
a fifth step of repeating the first step to the fourth step until a predetermined number of rows of the spot trains is formed.

9. The method of fabricating a piezoelectric oscillator according to claim 8, wherein the second step further comprises determining the train space so that the train space is smaller than the diameter of the film removal spot.

10. The method of fabricating piezoelectric oscillator according to claim 8, wherein the first step further comprises:
applying laser to position the film removal spots arranged in the first spot train in a tip end area of the mass adjustment film, and
partially cutting the film removal spots which is extended outward from the tip end area of the mass adjustment film.

11. The method of fabricating piezoelectric oscillator according to claim 8, further comprising:
forming the mass adjustment film of the weight portion having a coarse tuning film to be a weight for coarse tuning, and a fine tuning film to be a weight for fine tuning spaced from the coarse tuning film, and
arranging a plurality of spot trains on at least one of the coarse tuning film and the fine tuning film, and
wherein the first step further comprises:
applying laser to position the film removal spots in the one row of the spot train in a tip end area of at least one of the coarse tuning film and the fine tuning film, and
cutting a part of each of the film removal spots that is extended outward from the tip end area of the coarse tuning film or fine tuning film.

12. The method of fabricating piezoelectric oscillator according to claim 8, further comprising:
applying laser to position the film removal spots in side edge areas of the mass adjustment film, and
cutting a part of each of the film removal spots that is extended outward from each of the side edge areas of the mass adjustment film.

13. The method of fabricating piezoelectric oscillator according to claim 8, further comprising:
applying laser to form the predetermined number of rows of the spot trains on the right and left sides of the mass adjustment film and
cutting a part of each of the film removal spots that is extended outward from each of the right and left side edge areas of the mass adjustment film.

14. The method of fabricating piezoelectric oscillator according to claim 8, wherein a last row of the spot train is formed in asymmetry with respect to the center axis of the mass adjustment film.

15. The method of fabricating piezoelectric oscillator according to claim 8, further comprising:
forming the mass adjustment film on each of right and left oscillating arms of the tuning fork crystal vibrating piece, and
forming the plurality of the spot trains on the right and left mass adjustment films in bilateral symmetry with respect to the center axis of the tuning fork crystal vibrating piece.

16. The method of fabricating piezoelectric oscillator according to claim 8, wherein the rows of the spot trains are formed toward a base end of the tuning fork crystal vibrating piece.

* * * * *